(12) United States Patent
Kikuchi et al.

(10) Patent No.: US 7,713,378 B2
(45) Date of Patent: May 11, 2010

(54) OZONE PROCESSING DEVICE

(75) Inventors: Tatsuo Kikuchi, Amagasaki (JP); Takeo Yamanaka, Amagasaki (JP); Yukitaka Yamaguchi, Amagasaki (JP); Tokiko Kanayama, Amagasaki (JP)

(73) Assignee: Sumitomo Precision Products Co., Ltd., Amagasaki-shi (JP)

( * ) Notice: Subject to any disclaimer, the term of this patent is extended or adjusted under 35 U.S.C. 154(b) by 724 days.

(21) Appl. No.: 10/890,318

(22) Filed: Jul. 12, 2004

(65) Prior Publication Data
US 2004/0250768 A1 Dec. 16, 2004

Related U.S. Application Data

(63) Continuation of application No. PCT/JP02/12469, filed on Nov. 28, 2002.

(30) Foreign Application Priority Data
Jan. 24, 2002 (JP) .............................. 2002-015919

(51) Int. Cl.
C23F 1/00 (2006.01)
H01L 21/306 (2006.01)
C23C 16/56 (2006.01)
C23C 16/02 (2006.01)

(52) U.S. Cl. .................... 156/345.34; 118/722; 118/715

(58) Field of Classification Search ................ 118/715, 118/728, 722; 156/345.34
See application file for complete search history.

(56) References Cited

U.S. PATENT DOCUMENTS

| 4,951,603 | A | * | 8/1990 | Yoshino et al. | ............. 118/719 |
| 5,422,139 | A | * | 6/1995 | Fischer | .................... 427/248.1 |
| 6,302,964 | B1 | * | 10/2001 | Umotoy et al. | .............. 118/715 |
| 6,364,954 | B2 | * | 4/2002 | Umotoy et al. | .............. 118/715 |

FOREIGN PATENT DOCUMENTS

| JP | 05-259092 | 10/1993 |
| JP | 06-260434 | 9/1994 |
| JP | 07-058102 | 3/1995 |
| JP | 2001-262351 | 9/2001 |

* cited by examiner

*Primary Examiner*—Rudy Zervigon
(74) *Attorney, Agent, or Firm*—Westerman, Hattori, Daniels & Adrian, LLP

(57) ABSTRACT

A substrate ozone processing device includes: a substrate-carrying/heating platform; above the platform, a gas supply head made up of a main head unit bored with platform-directed vent holes, gas conduits connected at their basal ends to the gas vent holes and separated by an interspace communicating with the gas-supply-head exterior, and a plurality of coplanar facing plates perforated, top-side-to-underside, with gas-discharging through-holes receiving the distal ends of the gas conduits, and with a latticework of gaps surrounding the discharging through-holes and communicating with the interspace; and a gas supply device for supplying ozone gas to the discharging through-holes. The facing plates are of small volume such that even should heat transfer between the plates and the substrate occur, thermal equilibrium between the plates and the substrate is reached in a short time, facilitating substrate temperature management.

4 Claims, 6 Drawing Sheets

OZONE PROCESSING DEVICE

CROSS-REFERENCE TO RELATED APPLICATION

This application is a Continuation of International patent application Serial No. PCT/JP02/12469 filed Nov. 28, 2002, which was published in Japanese on Jul. 31, 2003 as WO 03/063222 A1, and Japanese Patent Application No. 2002-15919 filed Jan. 24, 2002 which is incorporated herein by reference in its entirety.

BACKGROUND OF THE INVENTION

1. Technical Field

The present invention relates to an ozone processing device which discharges a processing gas containing at least ozone onto the surface of a substrate such as a semiconductor substrate or a liquid crystal substrate in order to form or to improve an oxide film on the substrate surface or to remove a resist film formed on the substrate surface.

2. Description of the Related Art

FIG. 7 and FIG. 8 show examples of conventional ozone processing devices. FIG. 7 is a cross-section drawing showing a portion of an ozone processing device based on a conventional technology and is a cross-section drawing along the E-E line in FIG. 8. FIG. 8 is a bottom-view drawing along the D-D line in FIG. 7.

As FIG. 7 and FIG. 8 show, an ozone processing device 100 is equipped with: a mounting base 101 on which a substrate K is mounted; a gas supply head 102 disposed above the mounting base 101 so that it faces the substrate K. The mounting base 101 and the gas supply head 102 are disposed in a chamber (not illustrated) equipped with a closed space. The chamber (not illustrated) is formed with a suitable exhaust opening from which internal gasses are discharged to the outside.

The mounting base 101 is equipped with an internal heating device (not illustrated) formed from a heater. The substrate K mounted on the upper surface is heated by this heating device (not illustrated). Also, the mounting base 101 can be raised and lowered by a raising/lowering device (not illustrated).

The gas supply head 102 is formed from a nozzle module 103 and a cooling module 104, both formed as block-shaped members that are stacked vertically and bonded. A cavity 105 is formed on the upper surface of the nozzle module 103, i.e., the surface where it bonds with the cooling module 104. Nozzles 106, which communicate with the cavity 105 and open on the lower surface, are arranged in a plurality of rows in a staggered manner. Exhaust grooves 107, which open on the side surfaces, are formed on the bottom surface between the rows of the nozzle 106.

The cooling module 104 is formed from an upper member 104a and a lower member 104b, which are stacked vertically and bonded. A cooling fluid path 108 (108a, 108b) is formed on the bonding surface between the upper member 104a and the lower member 104b in a zigzag pattern extending from one side surface to the other side surface. The cooling fluid path 108 is connected by way of pipes 109, 110 to external cooling fluid supplying means 111. In this manner, the cooling fluid path 108, the pipes 109, 110, and cooling fluid supplying means 111 form a circulation path for cooling fluid to allow the cooling fluid to circulate.

The cooling module 104 is formed with a through-hole 112 that passes from the upper surface to the lower surface and communicates with the cavity 105. This through-hole 112 is connected by way of a pipe 114 connected thereto to an external ozone gas generating device 113. A predetermined concentration of ozone gas (processing gas) is supplied from ozone gas generating means 113 by way of the pipe 114 and the through-hole 112 to the cavity 105, and is discharged toward the substrate K from the lower openings of the nozzle 106.

With the ozone processing device 100 described above, the substrate K is mounted on the mounting base 101. The substrate K is mounted on heating means (not shown) and the mounting base 101 is raised by raising/lowering means (not shown) to a position, as shown in FIG. 7, where it is separated by a predetermined space from the gas supply head 102.

Then, the ozone gas is supplied from ozone gas generating device 113 to the cavity 105 by way of the pipe 114 and the through-hole 112, and this is blown toward the substrate K from the lower openings of the nozzles 106.

The ozone gas flows discharged from the nozzles 106 in this manner run into the surface of the substrate K, flow along the surface, and run into each other to form a flow toward the exhaust grooves 107. During this flow, the ozone ($O_3$) is heated by the substrate K. This heating and the contact with the substrate K and the resist cause the gas to break down into oxygen ($O_2$) and active oxygen ($O^*$). This active oxygen ($O^*$) forms an oxide film on the surface of the substrate K, improves the oxide film on the surface of the substrate K, or removes the resist film formed on the surface of the substrate K by a thermochemical reaction with the active oxygen ($O^*$).

Then, the ozone gas that flows into the exhaust grooves 107 after the processing it performs is exhausted by way of the exhaust grooves 107 from between the substrate K and the gas supply head 102.

In this ozone processing device 100, the gas supply head 102 is cooled by a cooling fluid, and the ozone gas that flows through the through-hole 112, the cavity 105, and the nozzle 106 is cooled by the cooling fluid. Thus, the ozone gas flowing through the through-hole 112, the cavity 105, and the nozzle 106 is prevented from undergoing thermal decomposition due to increased temperature, thus preventing the ozone concentration from dropping due to thermal decomposition.

Also, since the substrate K and the gas supply head 102 are brought close to each other so that the lower openings of the nozzles 106 can be near the substrate K, the ozone discharged from the nozzles 106 is prevented from being thermally decomposed before it reaches the substrate K and a thinner layer of ozone gas flowing on the substrate K is provided. This allows more ozone to contribute to the formation of the oxide film, the improvement of the oxide film, or the removal of the resist film.

In this conventional ozone processing device 100, the gas supply head 102 is positioned close to the substrate K as described above. This causes heat to transfer from the substrate K and the mounting base 101 to the gas supply head 102, resulting in an increase in temperature in the gas supply head 102.

Because the volume (capacity) of the gas supply head 102 is high and is cooled with the cooling fluid described above, thermal equilibrium in the substrate K and the gas supply head 102 becomes difficult to achieve and takes a long time. As a result, the temperature of the substrate K does not stay constant over a long period of time, leading to unevenness in the ozone processing operation.

Also, the processing gas discharged from the nozzles 106 flow into the exhaust grooves 107. The processing gas discharged from the nozzles 106 toward the center of the nozzle module 103 is discharged from the nozzles 106 disposed toward the ends because the gas discharged from the nozzles 106 flow into the exhaust grooves 107. The gas flowing into the exhaust grooves 107 obstructs the flow within the exhaust grooves 107, making it difficult for the gas discharged from the nozzles 106 toward the center from being exhausted out between the substrate K and the gas supply head 102.

BRIEF SUMMARY OF THE INVENTION

The object of the present invention is to overcome the problems described above and to provide an ozone processing device that allows easy management of the temperature of the substrate and that quickly exhausts the gas from the upper surface of the substrate after the gas finishes performing ozone processing operations.

The present invention relates to an ozone processing device including a carrying platform for carrying a substrate loaded onto the platform; a heating device for heating the substrate on the carrying platform; a gas supply head disposed over and above said carrying platform, the gas supply head made up of a main head unit bored with a gas flowpath and perforated with downward, carrying-platform-directed gas vent holes communicating with the gas flowpath, gas conduits of a predetermined length defining basal and distal ends, each said gas conduit connected at its basal end to one of the gas vent holes, said gas conduits separated by an interspace communicating with the gas-supply-head exterior, and a facing plate perforated, top-side-to-underside, with processing-gas-discharging through-holes each receiving a distal end of said gas conduits, and with a through-opening in between the discharging through-holes, communicating with the interspace; and a gas supplying device for supplying the processing gas to and discharging it through the discharging through-holes in the facing plate.

According to this invention, the processing gas containing ozone is supplied by gas supplying device and is discharged toward the substrate from the discharge openings on the facing plate disposed facing the substrate mounted on the carrying platform. The substrate is heated by the heating device.

The processing gas discharged in this manner collides with the substrate, forming a flow along the substrate. In this flow, the ozone ($O_3$) is heated. This heating and the contact with the substrate K and the resist causes it to break down into oxygen ($O_2$) and active oxygen ($O^*$). This active oxygen ($O^*$) results in the formation of oxide film on the substrate surface or improvement in oxide film on the substrate surface or removal of resist film formed on the substrate surface through thermochemical reaction.

The processing gas discharged from the discharge openings and flowing along the substrate then collides with each other to form a flow toward the through-opening. This is then exhausted toward the back side of the facing plate through the through-opening, i.e., is exhausted from between the substrate and the facing plate. As a result, the processing gas that has completed its processing operation does not remain above the substrate surface and the processing gas discharged from the discharge openings can reach the substrate surface unobstructed. This allows effective processing such as the formation or improvement of oxide film or removal of resist film.

The facing plate described above serves to control the thickness of the processing gas flow along the substrate surface. From this perspective, it would be preferable to have the facing plate disposed as close as possible to the substrate. This allows a thin gas flow layer over the substrate surface and allows more ozone to contribute to forming or improving oxide film or removing resist film, thus improving processing effectiveness.

When the facing plate is brought close to the substrate, however, thermal transfer from the substrate to the facing plate takes place. If the volume is large, as in the gas supply head in the conventional technology, thermal equilibrium between the two elements becomes difficult and the temperature of the substrate does not stay constant over a long period of time, thus leading to unevenness in processing. In the facing plate according to the present invention, however, the volume of the gas supply head is smaller than that of the conventional example, so this problem is corrected.

The through-openings are lined up to partition the facing plate into multiple regions, and a discharge opening is formed in each region partitioned by the through-opening.

This allows the processing gas discharged from the discharge openings to be effectively exhausted from between the substrate and the facing plate. If the regions are partitioned so they are the same size (area), the substrate surface can be processed without unevenness. The size of the regions can be set to suit the required processing speed.

The span of the through-opening preferably is at least 0.5 mm, and no more than 3 mm. If the opening span exceeds 3 mm, unprocessed sections corresponding to the through-opening can remain on the substrate surface. If the diameter is less than 0.5 mm, the processing-gas exhausting efficiency is very poor, and the processing effectiveness is reduced.

The through-opening can be formed as long, thin slits. In this case, it would be preferable, for the reasons described above, for the width of the slits to be at least 0.5 mm and no more than 3 mm.

It is possible to have a plurality of facing plates, each equipped with a discharge opening. The plurality of facing plates can be arranged in a co-planar manner with gaps formed between adjacent facing plates. Advantages similar to those described above can be provided with this structure. In this case, if the facing plates are all made the same size (area), the substrate surface can be processed without unevenness. The sizes of the facing plates can be set to suit the required processing speed.

In the present invention, an appropriate space must be maintained between the substrate and the facing plate, but the facing plate is heated by heat radiating from the heated substrate and the carrying platform so that thermal deformation can tend to take place. For this reason, if a large substrate with a large area is to be processed, using a single-piece facing plate can prevent an appropriate gap from being maintained with the substrate.

If the facing plates are formed from a suitable plurality of plates, the thermal deformation in each of the facing plates can be kept very small so that, as a result, the thermal deformation for the facing plates overall can be kept very small.

Substrates have been getting larger and larger in recent years, but with this structure, the surface of a large substrate can be processed uniformly even if the size exceeds 1100 mm×1300 mm.

Taking thermal deformation into account, it would be preferable for the thickness of the facing plate to be at least 0.1 mm, and more preferably at least 1 mm, in order to allow a good distance from the substrate to be maintained. Taking the time required to achieve thermal equilibrium in the facing plate, it would be preferable for the thickness to be no more than 5 mm, more preferably no more than 2 mm.

It is preferable for the space to be within the range of at least 0.5 mm and no more than 3 mm. If the space exceeds 3 mm, unprocessed sections on the substrate surface corresponding to the gaps can remain. If the space is less than 0.5 mm, the exhaust efficiency of the processing gas is very poor and the processing effectiveness is reduced.

Examples of materials for the facing plate include fluorinated resin, zirconia, mica, ceramic, stainless steel, silicon, aluminum, titanium, glass, and quartz. There are no restrictions on the shape, which can be triangular, rectangular, hexagonal, circular, and elliptical.

The carrying platform, heating device, and facing plate can be placed in a processing chamber forming a closed space with the substrate being processed in this processing chamber. In this case, the gasses in the processing chamber can be exhausted outside by exhausting means. By exhausting the gasses in the processing chamber, exhausting of gasses from the through-opening and gaps can take place smoothly with no obstructions.

The pressure in the processing chamber exhausted by exhausting means can be, in absolute pressure, at least 7 KPa. If the pressure in the processing chamber is less than 7 KPa, the exhaust speed at which gasses are exhausted from the through-opening and the gaps becomes too fast, reducing the time during which the processing gas lingers between the facing plate and the substrate and reducing the reaction efficiency. A more preferable pressure for the inside of the processing chamber is at least 14 KPa.

In terms of reaction efficiency, there are no restrictions to the upper limit of pressure inside the processing chamber, but in terms of the exhausting of product gas generated by the processing, it is be preferable for the pressure inside the processing chamber to be no more than the pressure (absolute pressure) of the processing gas supply source.

With the present invention as described above, the facing plate controls the thickness of the layer of processing gas flowing along the substrate surface, and the processing gas after the processing is completed (after reactions) is exhausted from the through-opening and the gaps between the facing plates. This makes it possible to uniformly process the entire substrate surface while improving reaction efficiency and processing efficiency for the processing gas.

The heating temperature of the substrate in the present invention can be in the range of 200°-500° C. Within this range, the processing described above can be performed while at the same time impurities contained in the substrate can be vaporized. Also, the processing gas can contain at least 14% by weight of ozone. A mixed gas of ozone and TEOS (Tetraethyl orthosilicate, $Si(C_2H_5O)_4$) can also be used.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

The present invention will be described in detail with references to the attached drawings.

Figure 1:
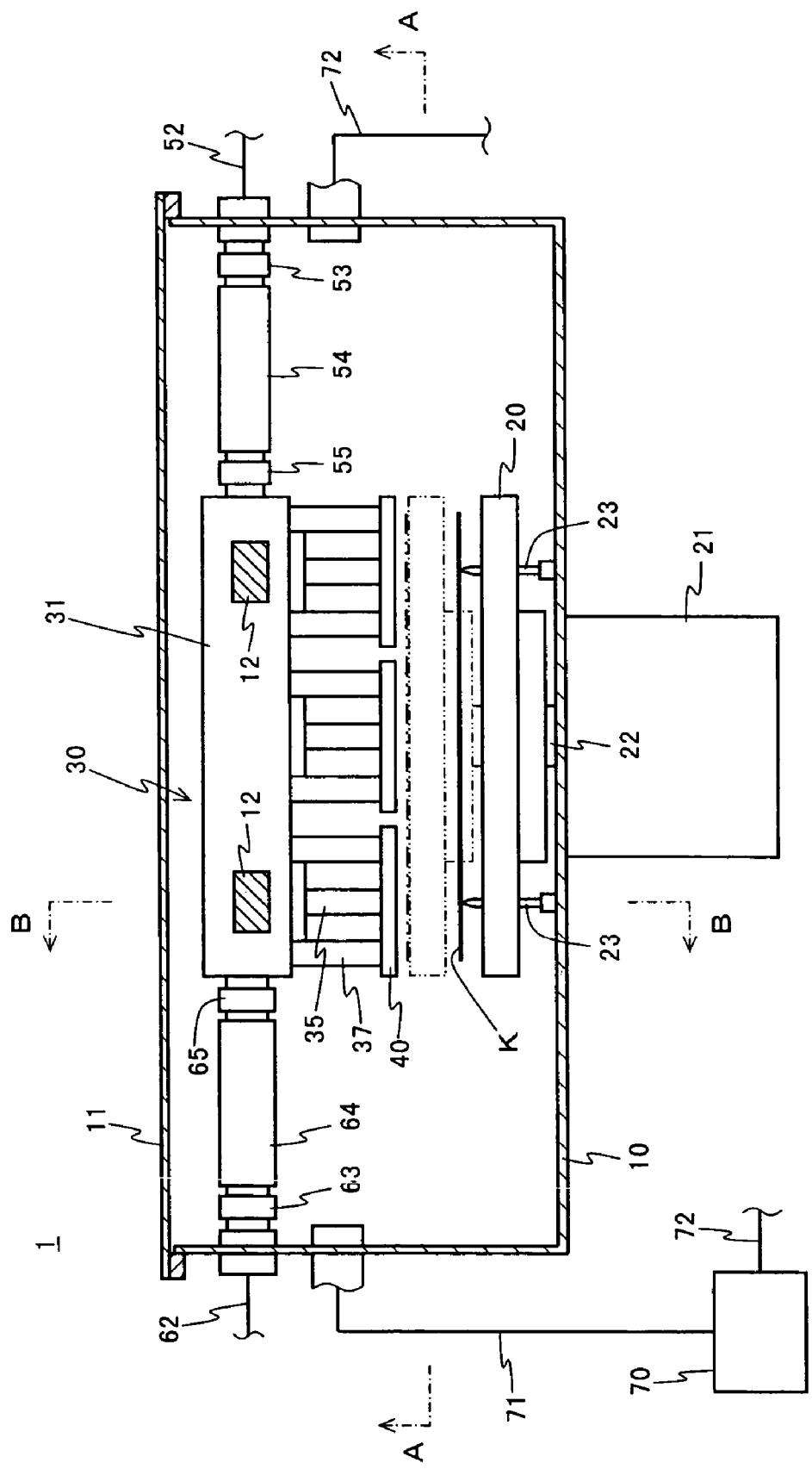
FIG. 1 is a cross-section drawing showing the simplified structure of an ozone processing device according to an embodiment of the present invention, and is a cross-section drawing along the C-C line in FIG. 2.
Figure 2:
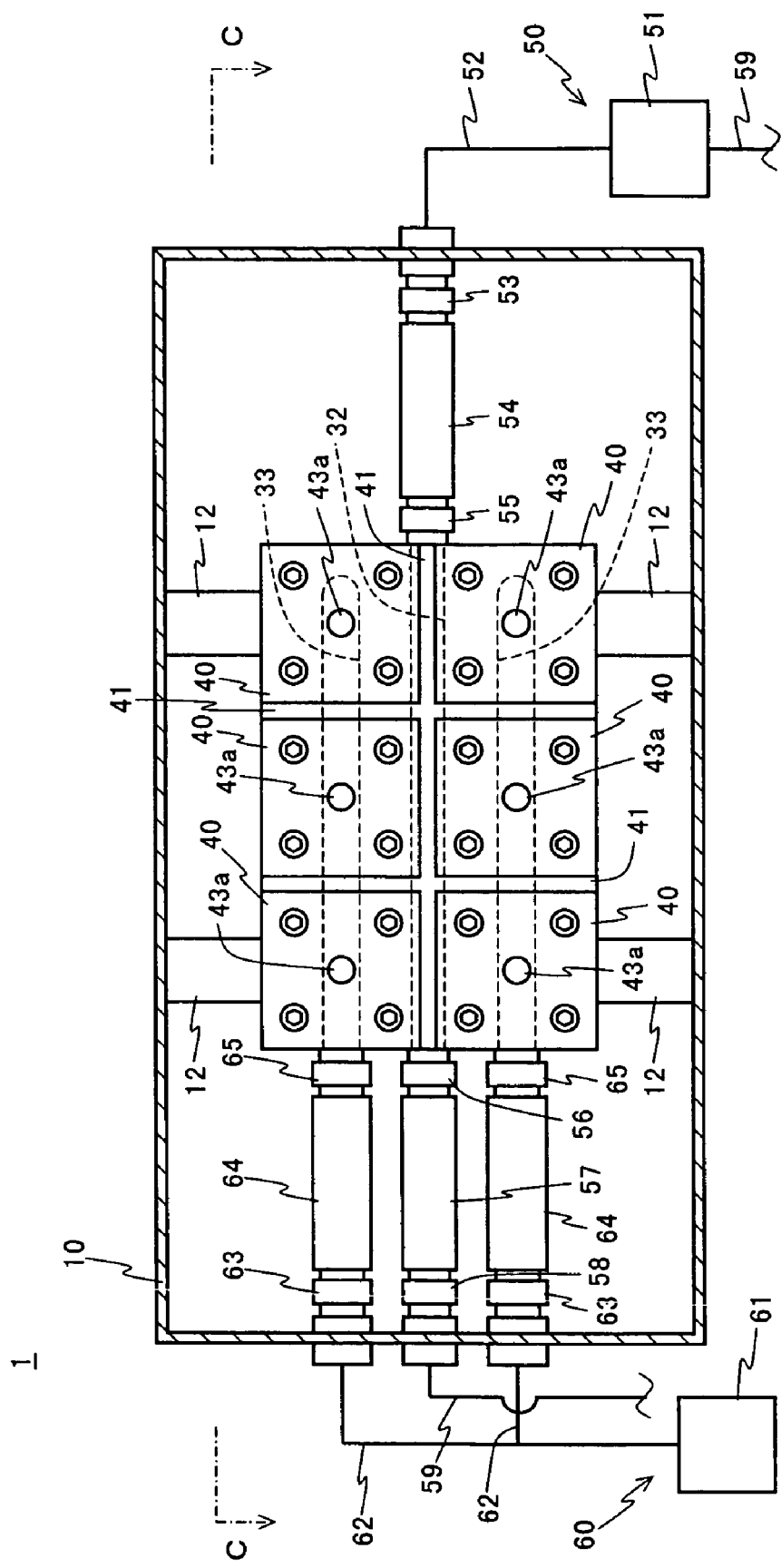
FIG. 2 is a cross-section drawing along the A-A line in FIG. 1.
Figure 3:
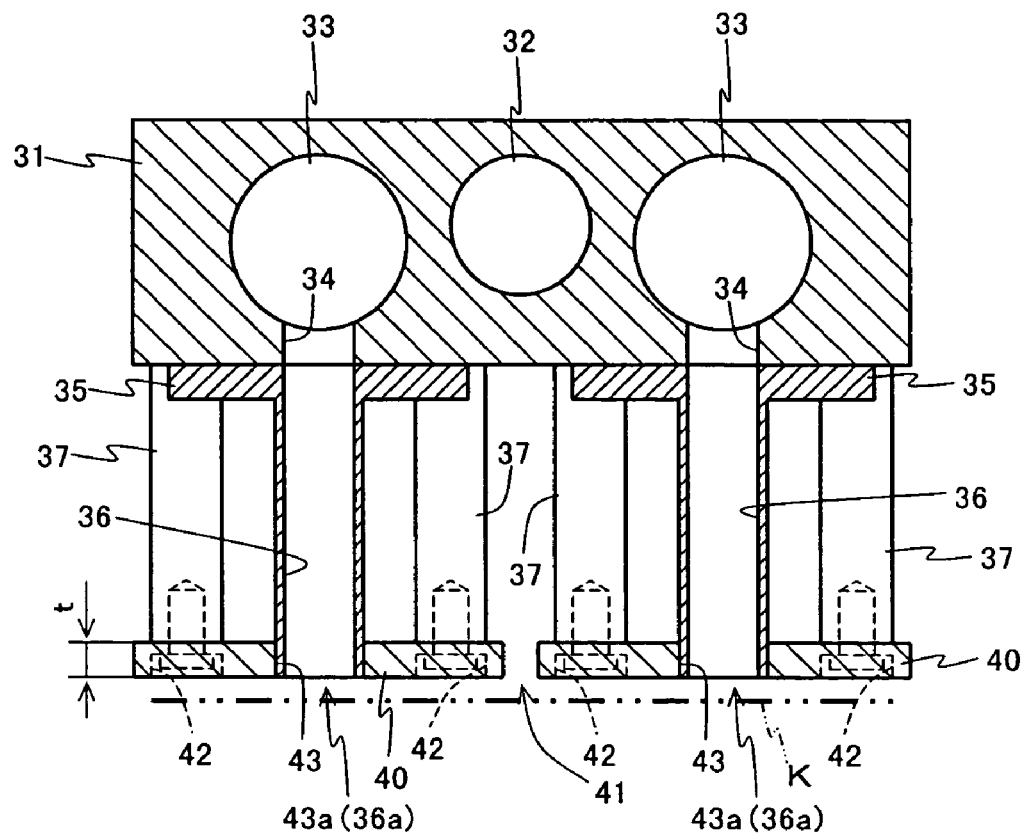
FIG. 3 is a cross-section drawing along the B-B line in FIG. 1.
Figure 4:
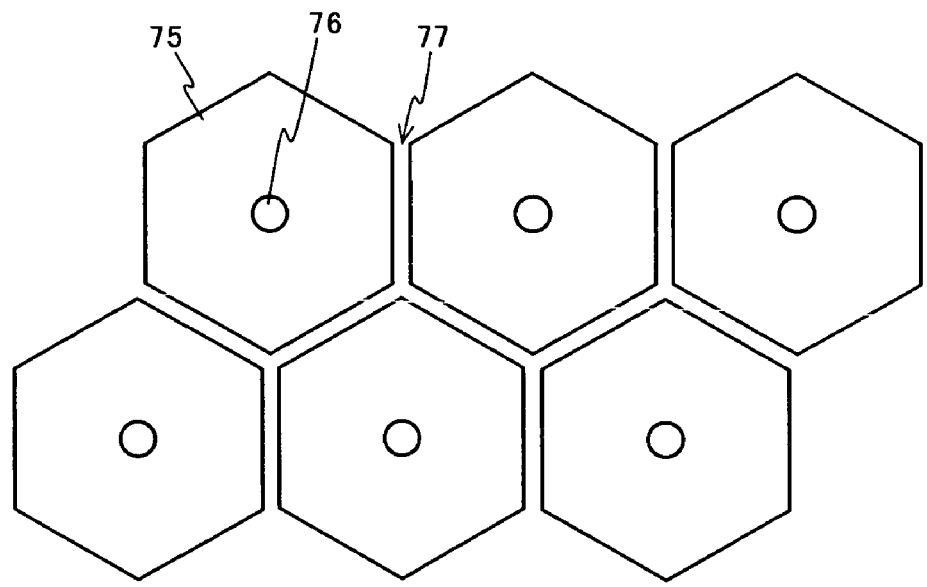
FIG. 4 through FIG. 6 are bottom-view drawings showing facing plates from other embodiments of the present invention.

As shown in FIG. 1 and FIG. 2, an ozone processing device 1 according to this example is equipped with a processing chamber 10 having a predetermined internal volume, a carrying platform 20 disposed in the processing chamber 10 and upon the upper surface thereof a substrate K is mounted, and a gas supply head 30 disposed above the carrying platform 20.

The processing chamber 10 is a case having a predetermined inner volume and closed by a cover 11. The processing chamber 10 is formed so that gasses therein are exhausted outside by an exhaust device 70 by way of exhaust pipes 71, 72, which are passed through and secured to side plates of the processing chamber 10. The exhaust device 70 adjusts the internal pressure (absolute pressure) of the processing chamber 10 so that it is at least 7 KPa (preferably at least 14 KPa) and no more than the pressure of the ozone gas supply source.

The carrying platform 20 is equipped with internal heating means (not shown) formed from a heater or the like. This heating means (not shown) heats the substrate K mounted on the upper surface. The carrying platform 20 can be raised and lowered by raising/lowering device 21. This raising/lowering device 21 is equipped with a raising/lowering rod 22 that passes through the bottom surface of the processing chamber 10. This raising/lowering rod 22 supports the carrying platform 20. The raising/lowering rod 22 supports the carrying platform 20. Raising/lowering device 21 is formed from, for example, a pneumatic cylinder, and an electric cylinder.

Multiple support needles 23 formed with tapered ends are projected from the bottom surface of the processing chamber 10, and the substrate K is loosely placed on the end surfaces. Support needles 23 are inserted through through-holes (not shown) formed on the carrying platform 20 when the carrying platform 20 is at its lowermost position, so that the ends project upward from the upper surface of the carrying platform 20. When the carrying platform 20 is at its uppermost position, the support needles 23 are pulled out from the through-holes (not shown).

The substrate K is loosely placed on the support needles 23 when the carrying platform 20 is at its lowermost position. Then, the carrying platform 20 is raised and the support needles 23 move down relative to the carrying platform 20 so that the substrate K is mounted on the carrying platform 20.

The gas supply head 30 is formed from a block-shaped main head unit 31 and multiple facing plates 40 disposed at a predetermined distance from the main head unit 31 and facing the substrate K on the carrying platform 20. The main head unit 31 is secured to the inner walls of the processing chamber 10 using securing members 12.

A cooling fluid flow path 32 passes through one side surface to the other side surface of he main head unit 31. Cooling fluid circulating device 50 shown in FIG. 2 supplies cooling fluid to the cooling fluid flow path 32, and this cooling fluid is circulated.

Cooling fluid circulating device 50 is formed from pipe fittings 56, pipes 57, pipe fittings 58, pipes 59, cooling fluid supplying device 51, a pipe 52, a pipe fitting 53, a pipe 54, and a pipe fitting 55, for example. The pipe fittings 56 are connected to one end of the cooling fluid flow path 32, and the pipe fitting 55 is connected to the other end of the cooling fluid flow path 32. A cooling fluid circulation path is formed in this manner from the pipe fittings 56, the pipes 57, the pipe fittings 58, the pipes 59, cooling fluid supplying means 51, the pipe 52, the pipe fitting 53, the pipe 54, the pipe fitting 55, and the cooling fluid flow path 32.

The cooling fluid 32 is supplied from cooling fluid supplying device 51 to the cooling fluid flow path 32 by way of the pipe 52, the pipe fitting 53, the pipe 54, and the pipe fitting 55, in that order. After it passes through the cooling fluid flow path 32, the supplied cooling fluid is circulated back to cooling fluid supplying device 51 by way of the pipe fittings 56, the pipes 57, the pipe fittings 58, and the pipe 59, in that order.

Formed in the main head unit 31 are an ozone gas flowpath 33, opening on one of the head unit's lateral sides, and gas vent holes 34, opening on the head unit's underside and communicating with the ozone gas flowpath 33, wherein connected to the gas vent holes 34 are gas conduits 35 extending toward the substrate K and provided with boreholes 36 penetrating from the upper side to the underside of the head unit 31.

Each facing plate 40 can be formed in a rectangular shape and is disposed in a co-planar manner so that predetermined gaps 41 are formed between adjacent facing plates 40. The facing plates 40 are secured with bolts to support members 37, which are secured to the lower surface of the main head unit 31. Between support members 37 of adjacent facing plates 40 is an interspace leading to the exterior of main head unit 31 and with which the gaps 41 communicate. If bolts are used for securing, counterbore holes 42 are formed on the facing plates 40 to prevent the bolt heads from projecting from the lower surfaces of the facing plates 40. Examples of materials preferable for the facing plates 40 include fluorinated resin, zirconia, mica, ceramic, stainless steel, silicon, aluminum, titanium, glass, and quartz.

Through-holes 43 passing from the upper surface to the lower surface are formed on the facing plates 40, and the lower ends of the gas conduits 35 are fitted to the through-holes 43. Lower surface openings 43a of the through-holes 43 serve, together with the lower openings 36a of the gas conduits 35, as discharge openings for discharging ozone gas. Ozone gas supplied from ozone gas supplying device 60 shown in FIG. 2 to the ozone gas flow path 33, the gas vent holes 34, and the boreholes 36 are discharged from these discharge openings 43a (36a) to the substrate K.

Ozone gas supplying device 60 is formed from pipe fittings 65 connected to the ozone gas flow path 33, pipes 64 connected to the pipe fittings 65, pipe fittings 63 connected to the pipes 64, pipes 62 connected to the pipe fittings 63, an ozone gas generating device 61 connected to the pipes 62, and the like. Ozone gas (processing gas) having a predetermined concentration is supplied from the ozone gas generating device 61 to the ozone gas flow path 33 by way of the pipes 62, the pipe fittings 63, the pipes 64, and the pipe fittings 65, in that order.

In the ozone processing device 1 described above, the substrate K is mounted on the support needles 23 using suitable means. At this point, the carrying platform 20 is at its lowermost position. The cooling fluid is supplied by cooling fluid supplying device 51 and is circulated through the cooling fluid circulation path 32 of the main head unit 31. The main head unit 31 is cooled by this cooling fluid.

Next, the pressure (absolute pressure) within the processing chamber 10 is adjusted by the exhaust device 70 to at least 7 KPa (preferably at least 14 KPa) and no more than the pressure of the gas supply source, and raising/lowering device 21 raises the carrying platform 20.

When the carrying platform 20 is raised, the support needles 23 are lowered relative to the carrying platform 20. The substrate K is mounted on the carrying platform 20 and the carrying platform 20 reaches its uppermost position. Also, the substrate K mounted on the carrying platform 20 is heated by heating device (not shown).

Then, ozone gas with a predetermined concentration is supplied from the ozone gas generating device 61 to the ozone gas flow path 33 of the main head unit 31 by way of the pipes 62, the pipe fittings 63, the pipes 64, and the pipe fittings 65, in that order. The gas passes through the gas vent holes 34 and the boreholes 36 and is blown toward the substrate K from the discharge openings 43a (36a) of the facing plates 40.

The ozone gas discharged in this manner collides with the substrate K and forms a flow along it. In this flow, the ozone ($O_3$) is heated by the substrate K. This heating and the contact with the substrate K and the resist causes it to breaks down into oxygen ($O_2$) and active oxygen ($O^*$). This active oxygen ($O^*$) forms an oxide film on the surface of the substrate K or improves the oxide film on the surface of the substrate K or removes the resist film formed on the surface of the substrate K through a thermochemical reaction.

The ozone gas discharged from the discharge openings 43a and flowing along the substrate K then collides with each other, forming a flow toward the gaps 41. The gas flows from the gaps 41 to the back surfaces (upper surfaces) of the facing plates 41 and through the interspace to exterior of the main head unit 31, i.e., is exhausted from between the substrate K and the facing plates 40. As a result, the ozone gas which has completed its processing operation is prevented from lingering around the surface of the substrate K to obstruct the flow of ozone gas discharged from the discharge openings 43a (36a) to the surface of the substrate K. This allows the operations such as forming or improving oxide film or removing resist film to be performed effectively.

The gaps 41 can be within the range of at least 0.5 mm and no more than 3 mm. If the gap 41 is less than 0.5 mm, the exhaust efficiency of the ozone gas is very poor and the processing effect of the ozone gas is reduced. If the gap exceeds 3 mm, unprocessed sections will remain at areas corresponding to the gaps 41.

By exhausting the gas in the processing chamber 10, the exhausting from the gaps 41 can be performed smoothly. In this process, it is preferable for the pressure (absolute pressure) in the processing chamber 10 to be at least 7 KPa (more preferably at least 14 KPa) and no more than the pressure of the ozone gas supply source.

If the pressure in the processing chamber 10 is less than 7 KPa, the exhausting from the gaps 41 becomes too fast, shortening the time during which the ozone gas can linger between the facing plates 40 and the substrate K and reducing the effectiveness of the reaction. If the pressure within the processing chamber 10 exceeds the pressure of the ozone gas supply source, the exhausting of the product gas generated by the processing does not take place smoothly.

The facing plates 40 serve to control the thickness of the ozone gas flow layer flowing along the surface of the substrate K. From this perspective, it is preferable to have the facing plates 40 be as close as possible to the substrate K. By doing this, the thickness of the layer of ozone gas flow along the surface of the substrate K can be made thinner, allowing more ozone to contribute to the formation or improvement of the oxide film or the removal of resist film, thus improving the processing effectiveness.

Thus, the space between the substrate K and the facing plates 40 must be maintained in an appropriate manner but the facing plates 40 are heated by radiated heat from the heated substrate K and the carrying platform 20, resulting in a tendency to thermally deform. As a result, when a substrate with a large area is to be processed, forming the facing plate 40 from a single plate may lead to thermal deformation that prevents the distance from the substrate K to be maintained appropriately.

In this example, the facing plates 40 are formed from multiple plates so that thermal deformation of each individual plate 40 can be kept very small. As a result, an effective distance from the substrate K can be used.

In recent years, substrates are becoming larger and larger, but with this arrangement, surfaces can be processed uniformly even for a large substrate K exceeding 1100 mm×1300 mm.

Taking thermal deformation into account, the thickness t for the facing plates 40 that allows an effective distance from the substrate K to be maintained is at least 0.1 mm, and more preferably at least 1 mm. Taking into account the time required for thermal equilibrium to be achieved in the facing plates 40, it would be preferable for the thickness t to be no more than 5 mm, more preferably no more than 2 mm.

If the facing plates 40 all have the same size (area), the surface sections of the substrate K corresponding to the facing plates 40 can be processed without unevenness. Also, the size of the facing plates 40 can be set to suit the required processing speed.

The atmospheric temperature within the processing chamber 10 is increased by the heating performed by heating means (not shown). The main head unit 31 is heated in this high-temperature atmosphere, but since the main head unit 31 is cooled by the cooling fluid flowing through the cooling fluid flow path 32, the ozone gas flowing through the ozone gas flow path 33 is cooled by the cooling fluid and the temperature thereof is kept within a fixed range. As a result, the thermal breakdown of ozone accompanying a rise in temperature is prevented and the lowering of the ozone concentration in the ozone gas is prevented.

The heating temperature of the substrate can be in the range 200°-500° C. Within this range, the operations described above can be performed while also vaporizing impurities contained in the substrate K. Also, the ozone gas can contain at least 14% by weight of ozone, or a mixed gas of ozone and TEOS (Tetraethyl orthosilicate, $Si(C_2H_5O)_4$).

With the ozone processing device 1 described in detail above, the thickness of the layer of ozone gas flowing along the surface of the substrate K is controlled by multiple facing plates 40 and the ozone gas that has completed processing operations (reactions) is discharged from the gaps 41 between the facing plates 40. This improves the reaction efficiency and the processing efficiency of the ozone gas and allows uniform processing of the entire surface even for a large substrate K exceeding 1100 mm×1300 mm.

The above description presents an embodiment of the present invention, but the implementations of the present invention are not restricted to this.

Figure 5:
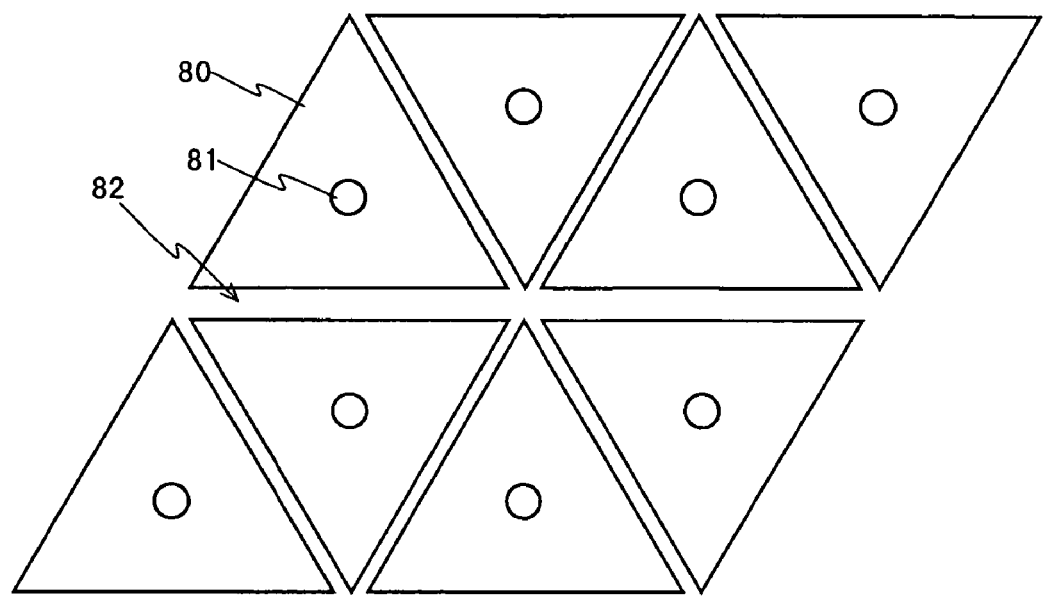

For example, the shape of the facing plates 40 is not restricted to the rectangular shape described above. Besides the rectangular shape, it is possible to have gaps 77 formed so that the facing plates 75 with discharge openings 76 are formed hexagonally. Alternatively, as shown in FIG. 5, gaps 82 can be formed so that the facing plates 80 with discharge openings 81 are formed with triangular shapes. Also, facing plates with different shapes such as triangles and rectangles can be combined.

Figure 6:
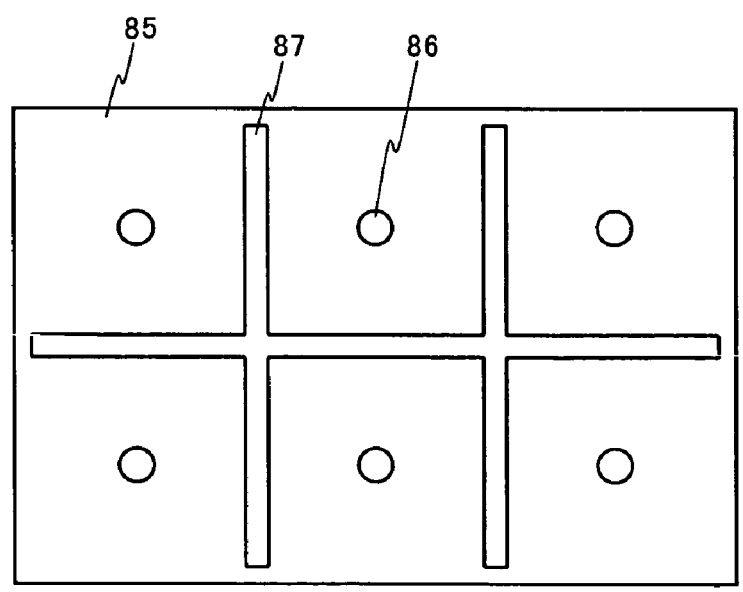
Figure 7:
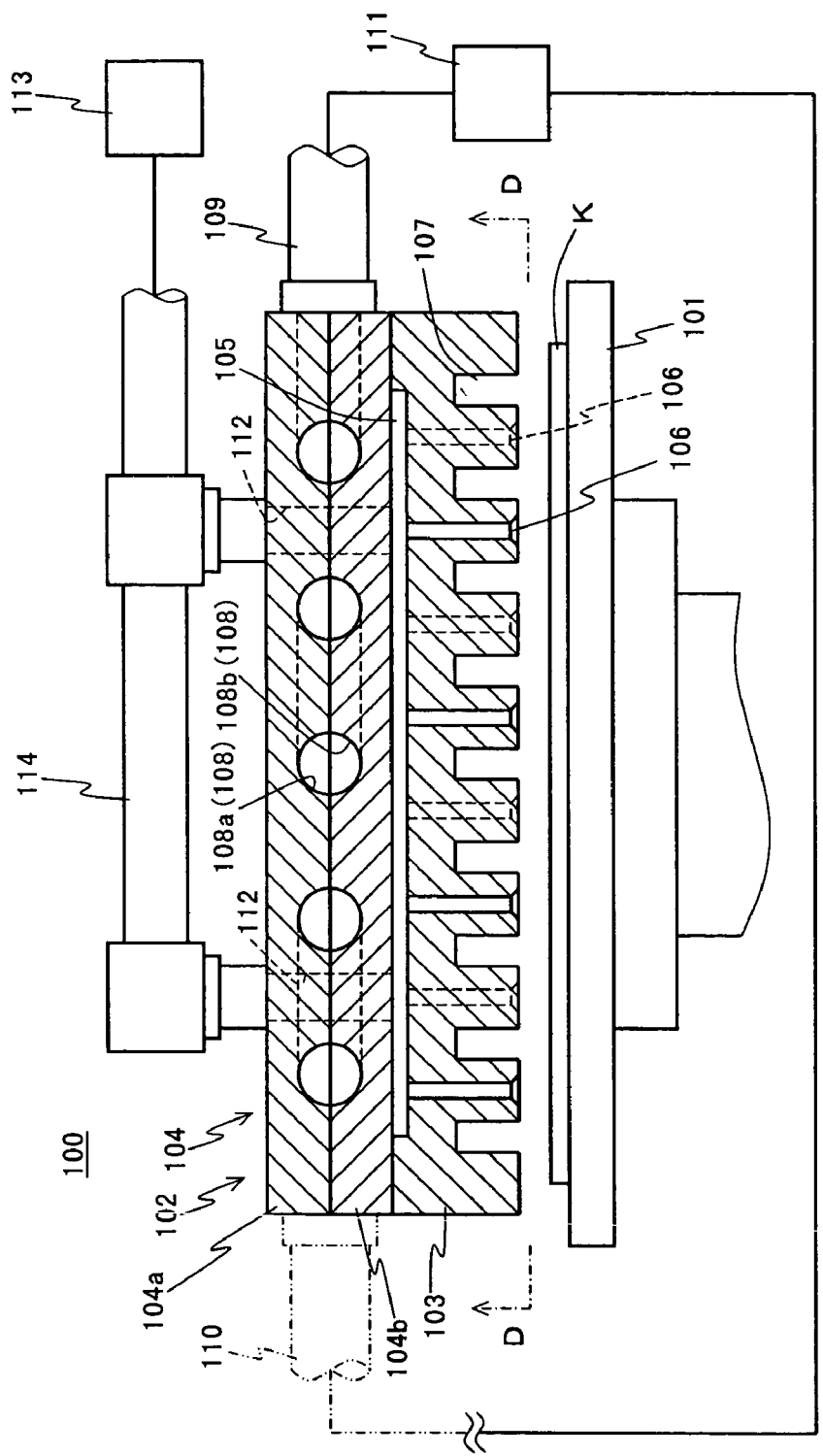
FIG. 7 is a cross-section drawing showing the simplified structure of an ozone processing device according to a conventional technology and is a cross-section drawing along the E-E line in FIG. 8.
Figure 8:
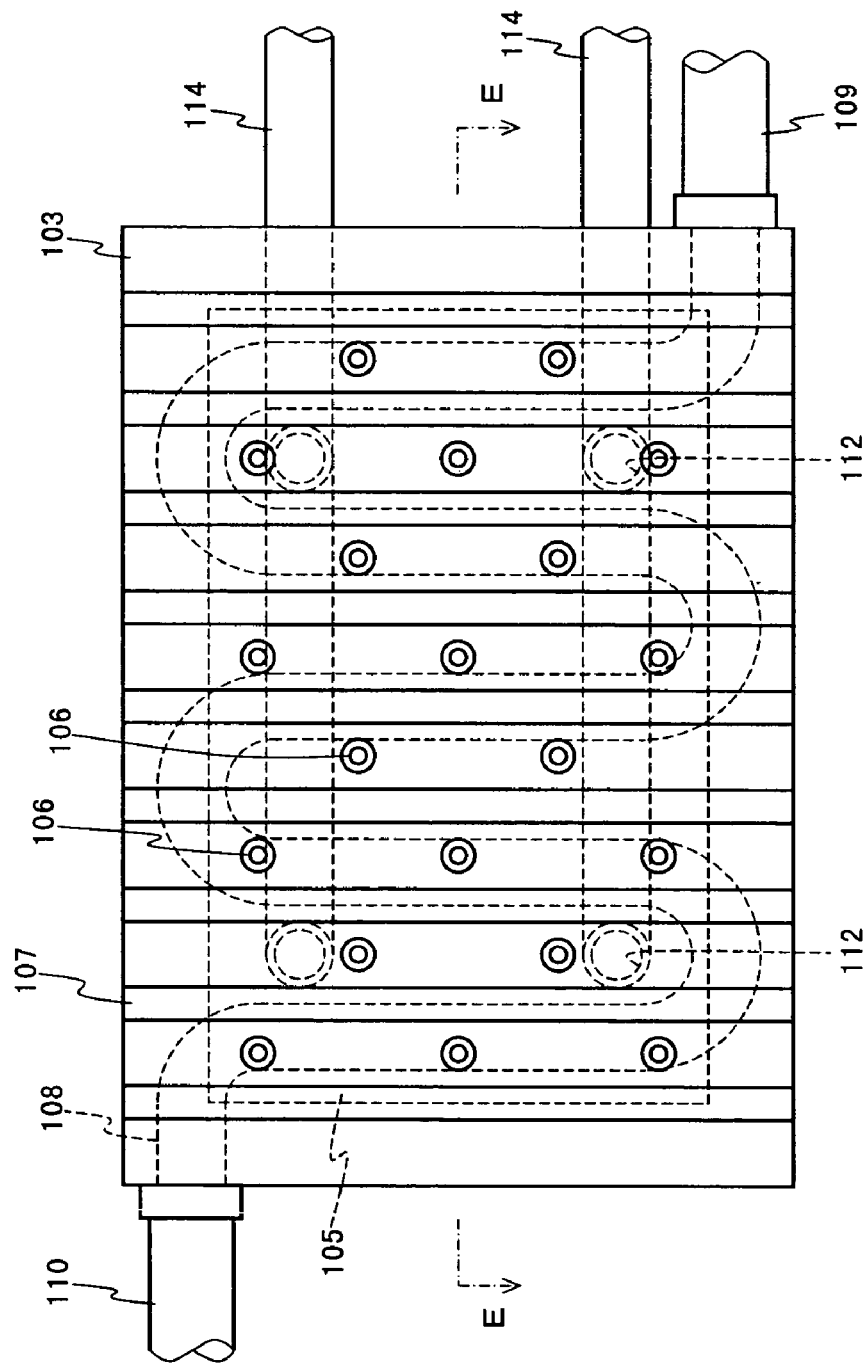
FIG. 8 is a bottom-view drawing along the D-D line in FIG. 7.

As shown in FIG. 6, an embodiment has multiple facing plates 40 formed from a single facing plate 85, with a slit-shaped through-opening 87 formed on the facing plate 85 to partition the surface into multiple regions, each region being formed with a discharge opening 86. Advantages similar to those described above can be obtained with this structure. In this case, taking into account the exhausting efficiency of the through-opening 87, it would be preferable for the slit width to be at least 0.5 mm and no more than 3 mm.

The slit-shaped through-opening 87 can be replaced with multiple circular holes that are lined up. In this case, the inner diameter of each circular hole can be at least 0.5 mm and no more than 3 mm.

As described above, the ozone processing device according to the present invention can be used effectively for forming oxide film on the surface of a substrate, e.g., a semiconductor substrate or a liquid crystal substrate, or improving oxide film formed on the substrate surface, or removing resist film formed on the substrate surface.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A device for ozone-processing of substrates, the device comprising:

a carrying platform for carrying a substrate loaded onto said platform;

a heating device for heating a substrate when loaded onto said carrying platform;

a gas supply head disposed over and above said carrying platform, said gas supply head made up of a main head unit bored with a gas flowpath and perforated, in its lower surface, with a plurality of downward carrying-platform-directed gas conduction holes communicating with the gas flowpath, the plurality of gas conduction holes scattered at a predetermined distance, a plurality of separate gas conduction pipes of a predetermined length defining basal and distal ends, each said gas conduction pipe connected at its basal end to one of the gas conduction holes, said gas conduction pipes mounted on the lower surface of said main head unit so as to hang downward, a plurality of separate facing plates perforated, top-side-to-underside, with a processing-gas-discharging through-holes for supplying processing-gas to the substrate, and arrayed in one-to-one correspondence at the distal ends of said gas conduction pipes in a manner of receiving the distal ends so that each processing-gas-discharging through-hole is connected to said gas conduction hole, the facing plates arrayed at a predetermined distance from said main head unit, each said facing plate arrayed on the same plane to be close to and face the substrate on the carrying platform for controlling a thickness of the processing gas flow layer flowing along the surface of the substrate after discharging through the processing gas-discharging through-hole; and a gas supplying device for supplying processing gas to and discharging it through the discharging through-holes in said facing plates;

wherein said facing plates are formed in a triangular, rectangular or hexagonal shape, and are arrayed in a lattice having gaps between adjacent plates for removing processing-gas existing between the substrate and the facing plates to a space between the facing plates and the main head unit, the span of said gaps in said latticework is at least 0.5 mm and not more than 3 mm, and the thickness of said facing plates is at least 0.1 mm and not more than 5 mm.

2. An ozone processing device as described in claim 1 wherein at least said carrying platform, said heating device, and said gas supply head are disposed in a processing chamber forming a closed space; and said processing chamber being equipped with an exhausting means for exhausting gas in said processing chamber to outside said processing chamber.

3. An ozone processing device as described in claim 2 wherein said exhausting means is configured to adjust the absolute pressure within said processing chamber to at least 7 KPa.

4. An ozone processing device as described in claim 2 wherein said exhausting means is configured to adjusts the absolute pressure within said processing chamber to at least 14 KPa.

* * * * *